(12) United States Patent
Szymanski

(10) Patent No.: US 11,639,952 B2
(45) Date of Patent: May 2, 2023

(54) METHOD FOR DETERMINING SHEET RESISTANCE

(71) Applicant: Uniwersytet w Bialymstoku, Bialystok (PL)

(72) Inventor: Krzysztof R. Szymanski, Bialystok (PL)

(73) Assignee: UNIWERSYTET W BIALYMSTOKU, Bialystok (PL)

( * ) Notice: Subject to any disclaimer, the term of this patent is extended or adjusted under 35 U.S.C. 154(b) by 397 days.

(21) Appl. No.: 16/907,450

(22) Filed: Jun. 22, 2020

(65) Prior Publication Data

US 2021/0396794 A1    Dec. 23, 2021

(30) Foreign Application Priority Data

Jun. 20, 2020   (PL) .......................................... 434393

(51) Int. Cl.
*G01R 27/14* (2006.01)
*G01R 1/073* (2006.01)

(52) U.S. Cl.
CPC ............. *G01R 27/14* (2013.01); *G01R 1/073* (2013.01)

(58) Field of Classification Search
CPC ................................ G01R 27/14; G01R 1/073
See application file for complete search history.

(56) References Cited

FOREIGN PATENT DOCUMENTS

CN          110426558 A  * 11/2019
WO     WO-2018127581 A1  * 7/2018  ......... G01R 1/06794

* cited by examiner

*Primary Examiner* — Lee E Rodak
(74) *Attorney, Agent, or Firm* — Mark M. Friedman (57) ABSTRACT

A method for determining a sheet resistance of a sample (1) by using point probes. The method includes: (a) positioning (101) five point probes (2a, 2b, 2c, 2d, 2e) on the sample (1) at selected positions which are distanced from an edge of the sample (1): (b) connecting (102) the five point probes (2a, 2b, 2c, 2d, 2e) in five configurations wherein each configuration comprises a different set of four point probes (abcd, bcde, cdea, deab, eabc) and measuring (103) a resistance ($r_1 = r_{abcd}$, $r_2 = r_{bcde}$, $r_3 = r_{cdea}$, $r_4 = r_{deab}$, $r_5 = r_{eabc}$) between the four point probes for each configuration; (c) determining (104) the sheet resistance ($\rho_o$).

4 Claims, 5 Drawing Sheets

|  | configuration in Fig. 4 | | | | | |
|---|---|---|---|---|---|---|
|  | a) | b) | c) | d) | e) | f) |
|  | column no. | | | | | |
| 1 | 2 | 3 | 4 | 5 | 6 | 7 |
| contacts order | u values | | | | | |
| abcde | 9.2645 | 8.0598 | 7.8503 | 7.7553 | 7.6640 | 7.9960 |
| abced | 12.1759 | 9.8712 | 7.8503 | 10.7385 | 10.7607 | 12.2412 |
| abdce | 11.8512 | 10.9131 | 11.1020 | 14.5819 | 14.0250 | 12.2788 |
| abdec | 16.0465 | 14.3426 | 13.5971 | 13.8405 | 13.5932 | 13.1827 |
| abecd | 9.2645 | 8.0598 | 7.8503 | 12.5484 | 11.8171 | 11.0600 |
| abedc | 11.8512 | 10.9131 | 11.1020 | 9.0121 | 8.4061 | 7.7088 |
| acbde | 17.8861 | 15.4334 | 13.5971 | 10.7385 | 10.7607 | 9.8877 |
| acbed | 16.2879 | 13.5667 | 11.1020 | 7.7553 | 7.6640 | 8.3260 |
| acdbe | 16.0465 | 14.3426 | 13.5971 | 12.5484 | 11.8171 | 8.3811 |
| acebd | 17.8861 | 15.4334 | 13.5971 | 14.5819 | 14.0250 | 12.4962 |
| adbce | 16.2879 | 13.5667 | 11.1020 | 13.8405 | 13.5932 | 12.6754 |
| adcbe | 12.1759 | 9.8712 | 7.8503 | 9.0121 | 8.4061 | 6.8050 |

|  | $r_1$ [mΩ] | $r_2$ [mΩ] | $r_3$ [mΩ] | $r_4$ [mΩ] | $r_5$ [mΩ] | $\rho$ [mΩ] | $\delta\rho$ [mΩ] |
|---|---|---|---|---|---|---|---|
| 1 | 2 | 3 | 4 | 5 | 6 | 7 | 8 |
| abcde | +2.860(1) | +1.830(1) | −1.491(2) | −1.6730(7) | +1.094(1) | 26.25 | 0.01 |
| abcde | +3.053(2) | +0.877(2) | −1.181(1) | −1.222(1) | +1.855(3) | 26.19 | 0.01 |
| abdce | −3.0309(7) | −0.9874(9) | +1.145(1) | +1.8502(9) | +0.708(1) | 26.19 | 0.01 |
| abdce | −1.851(1) | −1.886(1) | +0.863(2) | +3.0298(7) | +1.8874(6) | 26.18 | 0.01 |
| abcde | +3.682(1) | +1.1031(8) | −0.184(6) | −0.256(2) | +1.037(2) | 25.74 | 0.02 |
| abcde | +3.053(2) | +0.877(2) | −1.182(1) | −1.222(1) | +1.855(3) | 26.19 | 0.01 |

Fig. 9

METHOD FOR DETERMINING SHEET RESISTANCE

TECHNICAL FIELD

The invention relates to a method and a system for determining sheet resistance using probe contact.

BACKGROUND

There are four-probe point contact methods of measurement of sheet resistance, for example as described in the following publications:

- "Measurement of Sheet Resistivities with the Four-Point Probe" by F. M. Smits (Bell System Technical J. 37, 711 (1958)) [1];
- "The 100th anniversary of the four-point probe technique: the role of probe geometries in isotropic and anisotropic systems" by Miccoli et al. (J. Phys.: Condens. Matter 27 (2015) 223201) [2];
- "New method for calculation of the correction factors for the measurement of sheet resistivity of a square sample with a square four-point probe" by J. Shi et al. (Rev. Sci. Instrum. 68 1814 (1997)) [3];
- "A method of measuring specific resistivity and Hall effect of discs of arbitrary shape" by L. J. van der Pauw (Phil. Res. Repts 13 (1958)) [4]

SUMMARY OF THE EMBODIMENTS

The most important are in-line four probe, square four probe and the van der Pauw method. The first two techniques are essentially local and their precision depends on the precision of contact arrangement. Many works describe methods to introduce automatic measurements, increase precision and corrections related to non-perfect alignment of contacts. Such methods are disclosed for example in patent documents: U.S. Pat. Nos. 4,383,217, 6,815,959, EP0299875, U.S. Pat. No. 9,030,219, EP0134908, U.S. Pat. No. 3,783,375, EP1698905.

Multipoint probes were used in order to increase number of independent measurements. However, in the data analysis, four-probe measurements were used for extraction of the specific resistance, as disclosed for example in patent documents: EP1095282, U.S. Pat. Nos. 3,345,567, 8,536,572.

Applicant has recognized a need to provide a new, alternative method for determining sheet resistance, which would not require positioning of the probes at specific positions, but instead allow more freedom in placement of the probes, or even, in accordance with certain embodiments, to allow positioning of the probes at almost any arbitrary position.

Certain embodiments relate to a computer-implemented method for determining a sheet resistance of a sample (1) by using point probes, the method comprising the steps of:

(a) positioning five point probes on the sample at selected positions which are distanced from an edge of the sample:
(b) connecting the five point probes in five configurations wherein each configuration comprises a different set of four point probes and measuring a resistance between the four point probes for each configuration;
(c) using a data processor configured to determine the sheet resistance ($\rho_0$) based on an equation that relates the sheet resistance ($\rho_0$) to each of the resistances, $r_1$, $r_2$, $r_3$, $r_4$, $r_5$.

In some embodiments this equation is in the form of $f(\rho_0, r_1, r_2, r_3, r_4, r_5)=1$. In some embodiments this equation is in a form of $f(\rho_0, r_1, r_2, r_3, r_4, r_5)=1$, wherein $$f(\rho, r_1, r_2, r_3, r_4, r_5) = \sum_{i=1}^{5}\left(x_i - x_i x_{i+2} - x_i x_{i+1} x_{i+3} + x_i x_{i+2}^2 x_{i+4}\right) - x_1 x_2 x_3 x_4 x_5$$

and $$x_i = \exp\frac{-4\pi r_i}{\rho}, i = 1, \ldots 5.$$

The selected positions of the five point probes may include the following set of relative coordinates: {(1.00, 0.00), (0.45, 0.24), (−0.95, 0.30), (−0.95, −0.30), (−0.30, −0.81)} each within an accuracy of ±0.05.

The method may comprise positioning more than five probes in step (a) and performing steps (b) and (c) for different sets of five probes to obtain independent information on the measured sheet resistance for each set.

One of the probes can be a scanning probe and the method may comprise repeating steps (a)-(c) wherein step (a) in successive iterations includes changing the position of the scanning probe (2e) such that the determined sheet resistance ($\rho_0$) in step (c) for successive iterations can be used to determine lateral distribution of the sheet resistance corresponding to the positions of the scanning probe.

Other embodiments relate to a system for determining a sheet resistance of a sample by using point probes, the system comprising: five point probes for positioning on the sample; a current and voltage meter configured to measure current and voltage and calculate values of resistances between the point probes; a data processor (for example coupled to or in communication with to the current and voltage meter) that determines the sheet resistance ($\rho_0$) based on an equation $f(\rho_0, r_1, r_2, r_3, r_4, r_5)=1$. The data processor determines the sheet resistance ($\rho_0$) based on an equation that relates the sheet resistance (Po) to each of the resistances, $r_1$, $r_2$, $r_3$, $r_4$, $r_5$. This equation is in the form of $f(\rho_0, r_1, r_2, r_3, r_4, r_5)=1$ (or a form that is algebraically equivalent thereto). This equation is in a form of $f(\rho_0, r_1, r_2, r_3, r_4, r_5)=1$, wherein $$f(\rho, r_1, r_2, r_3, r_4, r_5) = \sum_{i=1}^{5}\left(x_i - x_i x_{i+2} - x_i x_{i+1} x_{i+3} + x_i x_{i+2}^2 x_{i+4}\right) - x_1 x_2 x_3 x_4 x_5$$

and $$x_i = \exp\frac{-4\pi r_i}{\rho}, i = 1, \ldots 5.$$

wherein the resistance values correspond to resistance measurements provided by the current and voltage meter during a procedure that involves:
(a) positioning the five point probes on the sample at selected positions which are distanced from an edge of the sample;
(b) connecting the five point probes in five configurations and measuring, by the current and voltage meter, a resistance for each configuration.

The method according to some embodiments of the invention involves use of five probes located close to each other, far from the sample edge, but at almost any arbitrary position. Measurement using five probes brings in principle more information than measurements with four contacts, and this extra information is used for determination of the sheet resistance in agreement with Laplace equations for flows in homogeneous infinite plane.

As compared to the van der Pauw method (wherein the contacts can be almost arbitrarily arranged on the sample edge), the five contacts in the method according to the invention can be located far from the edge in accordance with certain embodiments.

As compared to the known four point methods (in-line four probe and square four probe), wherein the contacts can be located far from the edge, the method according to certain embodiments of the invention does not require a precise placement of probes (wherein the four point methods require a precise placement, which is problematic in particular in microscopic or nanoscopic scale) because it is based on the equation (5) (as discussed below) that has been developed for this five probes case.

These and other features, aspects and advantages of the invention will become better understood with reference to the following drawings, descriptions and claims.

BRIEF DESCRIPTION OF DRAWINGS

Various embodiments are herein described, by way of example only, with reference to the accompanying drawings, wherein.

DETAILED DESCRIPTION OF THE EMBODIMENTS

The following detailed description is of the best currently contemplated modes of carrying out the invention. The description is not to be taken in a limiting sense, but is made merely for the purpose of illustrating the general principles of the invention.

Introduction—Four Point Probe

Figure 1:
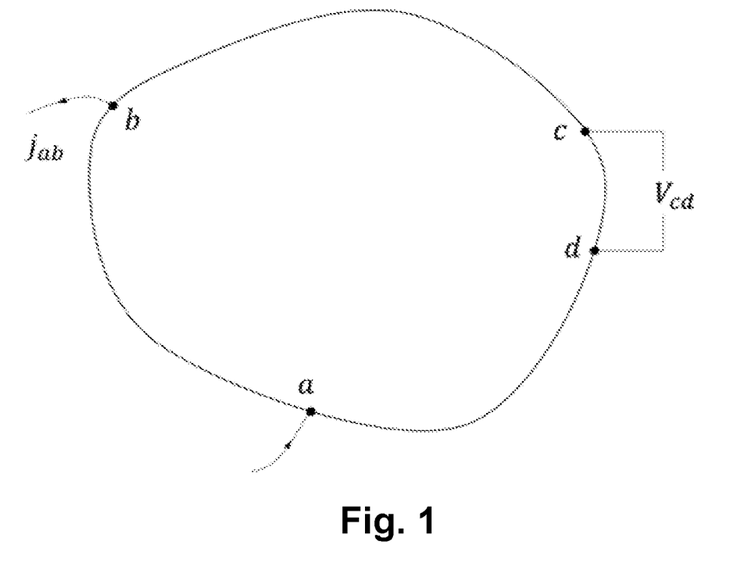
FIG. 1 shows an example arrangement of four contacts located on an edge of a sample in accordance with one embodiment.
Figure 2:
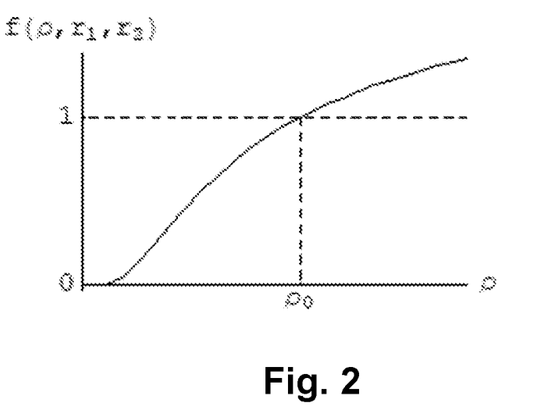
FIG. 2 shows a curve $f(\rho, r_1, r_2)$ crossing line with ordinate equal to 1 at point $\rho_0$, in accordance with one embodiment.

First, as an introduction, four point probe will be described. Assume the probes are positioned at arbitrary positions a, b, c, d on a homogeneous infinite thin conducting plane. The four-probe resistance can be defined in a standard way as $r_{abcd}=V_{cd}/j_{ab}$ wherein the current $j_{ab}$ enters the sample at the contact a and leaves at the contact b, whereas the potential $V_{cd}$ is measured between contacts c and d, as shown in FIG. 1. Two resistances $r_1=r_{abcd}$ and $r_2=r_{bcda}$ are measured on the sample of an arbitrary shape with four contacts located at the edge at arbitrary positions. Next, a function $f(\rho, r_1, r_2)$ can be defined as:

$$f(\rho, r_1, r_2) = x_1 + x_1, \quad (1)$$

wherein $x_1=\exp(-\pi r_1/\rho)$, $x_2=\exp(-\pi r_2/\rho)$. A curved line resulting by drawing of $f(\rho, r_1, r_2)$ as function of p, as shown in FIG. 2, crosses the horizontal line with an ordinate equal to 1 at point $\rho_0$, a value which fulfil the van der Pauw equation $$\exp\frac{-\pi r_1}{\rho_0} + \exp\frac{-\pi r_2}{\rho_0} = 1 \quad (2)$$

where $\rho_0$ is a sheet resistance. This briefly describes the van der Pauw method in a nonconventional form, and will serve as a help in explanation of the invention as follows.

Five Point Probe

Figure 3:
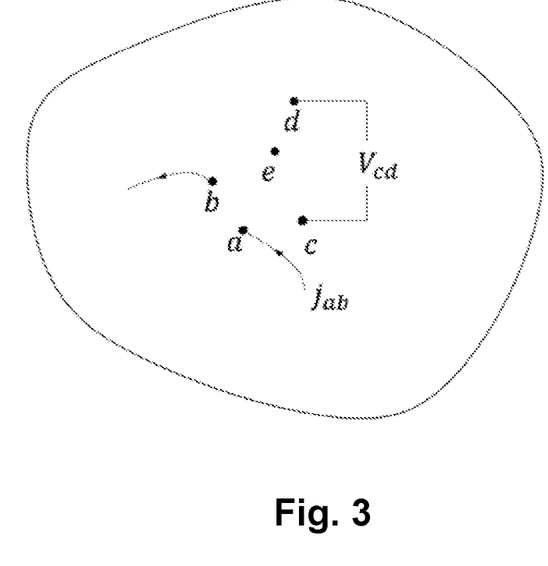
FIG. 3 shows an example of arrangement of five point contacts at positions a, b, c, d, e, where measurement of resistance $r_{abcd}$ is performed in accordance with one embodiment.

Now, in reference to the method according to certain embodiments of the invention, five point contacts will be considered as located at arbitrary positions a, b, c, d, e, on homogeneous thin conducting plane, close to each other and far from the sample edge, as shown in FIG. 3. Five four-probe resistances $r_1, r_2, r_3, r_4, r_s$ are measured and their values are defined as $r_1=r_{abcd}$, $r_2=r_{bcde}$, $r_3=r_{cdea}$, $r_4=r_{deab}$, $r_5=r_{eabc}$. A function $f(\rho, r_1, r_2, r_3, r_4, r_5)$ is constructed as:

$$f(\rho, r_1, r_2, r_3, r_4, r_5) = \sum_{i=1}^{5}(x_i - x_i x_{i+2} - x_i x_{i+1} x_{i+3} + x_i x_{i+2}^2 x_{i+4}) - x_1 x_2 x_3 x_4 x_5,, \quad (3)$$

wherein $x_{i+5}=x_i$ is used in order to define $x_i$ for indices outside the range 1, . . . 5, and $$x_i = \exp\frac{4\pi r_i}{\rho}, i = 1, \ldots 5. \quad (4)$$

It can be proven that $$f(\rho_0, r_1, r_2, r_3, r_4, r_5) = 1, \quad (5)$$

where $\rho_0$ is the sheet resistance. Thus, for five contacts a, b, c, d, e located at arbitrary positions, a curved line $f(\rho, r_1, r_2, r_3, r_4, r_5)$ as a function of p, crosses a horizontal line with ordinate 1 at point $\rho_0$, which is the sheet resistance. In this way sheet resistance $\rho_0$ can be determined.

FIGS. 4a-4f show examples of various arrangements of contacts, while plots of $f(\rho, r_1, r_2, r_3, r_4, r_5)$ showing corresponding graphical determination of sheet resistance $\rho_0$ are shown in FIGS. 5a-5f. Values of $r_i$ according to equation (4) in equation (3) correspond to the resistances of contacts located on the plane with sheet resistance $\rho_0$. For some non-equivalent permutations the curves overlap. All curves cross horizontal line with ordinate equal to 1 $\rho = \rho_0$.

Derivation of the Formula for the Five Point Method

Assume four point contacts at arbitrary positions a, b, c, d on homogeneous infinite thin conducting plane. It follows from elementary analysis that for an four-probe resistance $r_{abcd}$, $$r_{abcd} = \frac{\rho_0}{2\pi} \ln \frac{|ac| \, |bd|}{|ad| \, |bc|}, \quad (6)$$

wherein |ac| is a distance between points a and c. The parameter $\rho_0$ is the sheet resistance. For further mathematical derivation consider the plane as a complex plane, and treat positions of five contacts a, b, c, d, e, as complex numbers (a, b, c, d, e $\in \mathbb{C}$). It is known from analysis of complex numbers, that potentials and currents are invariant under conformal transform of a complex domain. Möbius map;

$$z \to f(z) = \frac{\alpha z + \beta}{\gamma z + \delta} \quad (7)$$

is an example of a conformal transform of a complex plane into itself (f in equation (7) should not be confused with $f$ in equations (1) and (3)). It has an additional property that is uniquely defined by indicating three arguments $z_1, z_2, z_3 \in \mathbb{C}$ and then images $f_1, f_2, f_3 \in \mathbb{C}$. This means that if one chooses three points on a complex plane $z_1, z_2, z_3$ and three other points $f_1, f_2, f_3$, it is possible to find explicit form of the Mobius map, i.e. determinate numbers $\alpha, \beta, \gamma, \delta$ so, that $f(z_i) = f_i$ for i=1,2,3. These considerations show that for any three points a, b, c one can find the Mobius map $f$ by transforming them into 1, 0 and −1. Equation (6) expressed in terms of complex variables is:

$$r_{abcd} = \frac{\rho_0}{2\pi} \ln \frac{|a-c| \, |b-d|}{|a-d| \, |b-c|}, \quad (8)$$

wherein |z| is the modulus of the complex number z. One can show by direct calculations that equation (6) is invariant under the Mobius transformation. Thus, without any loss of generality, one may consider the problem of four contact located so that three of them has specific coordinates, a=−1, b=0, c=1, while the two others are located on general positions, d=$\mu_1$+i$v_1$, e=$\mu_2$+i$v_2$, wherein $\mu_1, v_1, \mu_2, v_2$ are real numbers. Using the abbreviation introduced by equation (4) the following can be calculated:

$$x_1 = \frac{(1+\mu_1)^2 + v_1^2}{4(\mu_1^2 + v_1^2)}, \quad (9)$$

$$x_2 = \frac{(1 - 2\mu_1 + \mu_1^2 + v_1^2)(\mu_2^2 + v_2^2)}{(1 - 2\mu_2 + \mu_2^2 + v_2^2)(\mu_1^2 + v_1^2)}, \quad (10)$$

$$x_3 = \frac{4(\mu_1 - \mu_2)^2 + 4(v_1 - v_2)^2}{(1 + 2\mu_1 + \mu_1^2 + v_1^2)(1 - 2\mu_2 + \mu_2^2 + v_2^2)}, \quad (11)$$

$$x_4 = \frac{(1 + 2\mu_2 + \mu_2^2 + v_2^2)(\mu_1^2 + v_1^2)}{(1 + 2\mu_1 + \mu_1^2 + v_1^2)(\mu_2^2 + v_2^2)}, \quad (12)$$

$$x_5 = \frac{(1-\mu_2)^2 + v_2^2}{4(\mu_2^2 + v_2^2)}. \quad (13)$$

Using equations (9) and (13) one may calculate $v_1$ and $v_2$, introduce them into equations (10), (11), (12), then from equations (10) and (12) one may calculate $\mu_1$ and $\mu_2$. A temporary result is given by:

$$v_1 = \pm \frac{\sqrt{4x_1 - (1 + x_1 - x_2 x_5)^2}}{1 - 2x_1 - 2x_2 x_5}, \quad (14)$$

$$v_2 = \pm \frac{\sqrt{4x_5 - (1 + x_5 - x_1 x_4)^2}}{1 - 2x_5 - 2x_1 x_4}, \quad (15)$$

$$\mu_1 = \frac{x_2 x_5 - x_1}{1 - 2x_1 - 2x_2 x_5}, \quad (16)$$

$$\mu_2 = \frac{x_5 - x_1 x_4}{1 - 2x_5 - 2x_1 x_4}. \quad (17)$$

Finally, introducing $v_1, v_2, \mu_1, \mu_2$ into equation (11) one gets a relationship between $x_1, x_2, x_3, x_4, x_5$ with $v_1, v_2, \mu_1, \mu_2$ eliminated. Because the resistances $r_i$ in equation (4) correspond to the cyclic permutations of contacts, the relation obtained from equation (11) can be arranged into the form of equation (3).

Figure 5A:
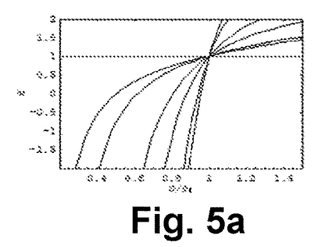
FIGS. 5a-5f show values of $f$ according to equation (3) plotted as a function of p for arrangements of contacts abcde shown in corresponding FIGS. 4a-4f and for inequivalent permutations of abcde listed in the table of FIG. 8, in accordance with an embodiment.
Figure 5B:
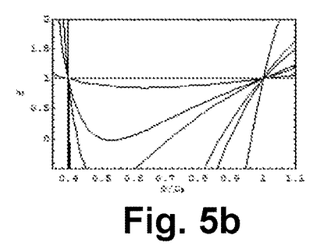
Figure 5C:
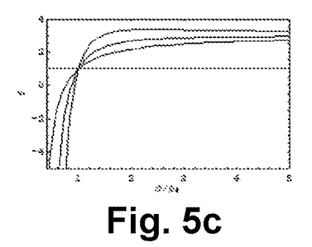
Figure 5D:
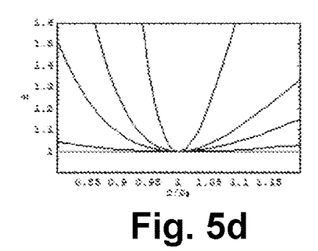
Figure 5E:
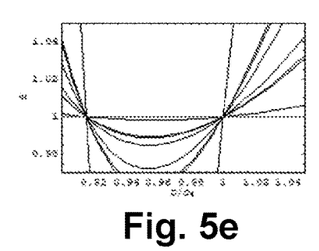
Figure 5F:
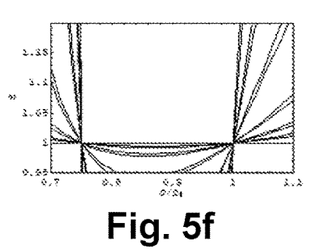

Equations (14) and (15) serve for two possible solutions, therefore there may appear two solutions for the sheet resistivity measurements. This effect is illustrated in FIG. 5. Nonphysical solutions appear for $\rho < \rho_0$ (see $\rho \approx 0.4\rho_0$, $\rho \approx 0.92\rho_0$ and $\rho \approx 0.75\rho_0$ for FIGS. 5b), 5e) and 5f), respectively.

In practice, two independent measurements with two different arrangements of five contacts indicate which value should be considered as the sheet resistance. It can be shown that five positions located on a straight line or on a circle correspond theoretically to a single solution for $\rho_0$ (FIG. 5d). However, a nonperfect alignment of contacts on a straight line or on a circle results in two different and similar solutions for $\rho_0$. These configurations are experimentally unlikely, and one has to avoid them when sheet resistance is measured.

Precision of the Method

It is clear from the equation (3), that $f$ is invariant under any permutation of $r_i$. Therefore, equation (5) is valid for any permutation. However, when one solves equation (5) to get $\rho_0$, its precision depends on the contact positions a, b, c, d, e and also on the permutations of $r_i$. This is because under reasonable assumptions that uncertainties of all measured values $r_i$ are the same, equal to $\delta r$, the precision of the sheet resistance $\delta p$ can be estimated as:

$$(\delta\rho)^2 = \left(\frac{\partial f}{\partial \rho}\right)^{-2} \sum_{i=1}^{5}\left(\frac{\partial f}{\partial r_i}\right)^2 (\delta r)^2 \stackrel{def}{=} u^2(\delta r)^2. \quad (18)$$

Figure 8:
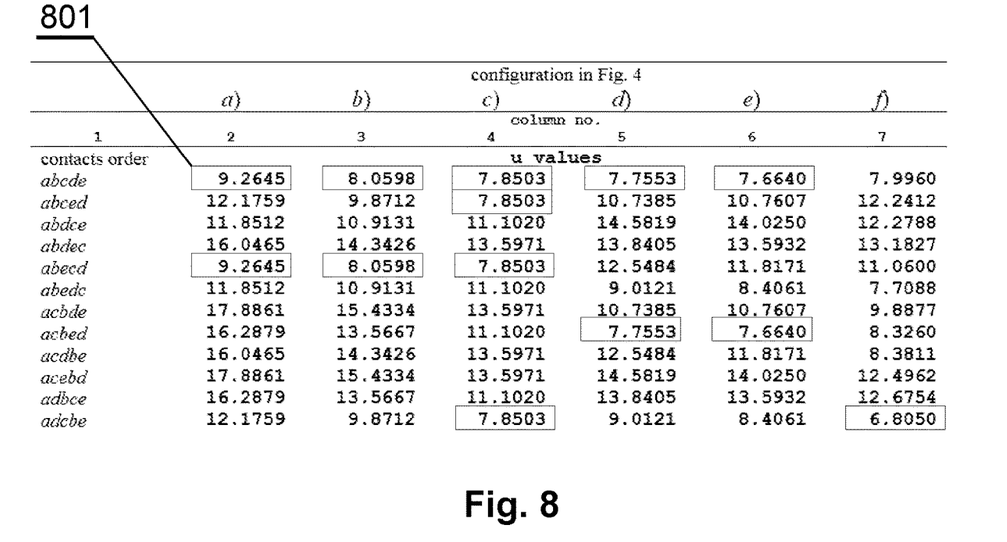
FIG. 8 shows a table with values of uncertainty parameter u according to equation (18) for non-equivalent permutations of contacts with arrangements shown in FIGS. 4a-4f in accordance with an embodiment.

For a given order of contacts abcde, there are five circular permutations generated by moving the final element of the linear arrangement to its front: abcde, eabcd, deabc, cdeab, bcdea. Similarly, for reverse order edcba. For all these ten permutations uncertainty parameter u (18) have the same value. Therefore one expect to have 5!/10=12 different values of u. Some examples illustrating this are shown in FIG. 1 and are listed in the table of FIG. 8 (permutations for which best value of u is achieved are indicated by marked-up cells 801). The best precision corresponds to the smallest value of u or the largest slope of the lines crossing horizontal line with ordinate equal to 1 in FIGS. 5a-5f. This happens for some permutation of contacts with positions forming vertices of irregular hexagon (as in FIG. 5f and the table of FIG. 8, column 7).

It is interesting to see what are the solutions of the equation (5) for different inequivalent permutations of contacts abcde. We have calculated resistances $r_i$ (4) for contacts arrangements shown in FIGS. 5a-5f for the plane with the sheet resistance $\rho_0$ and values of function $f$ were drawn for inequivalent permutations of contacts abcde, as in FIGS. 5a-5f. In all cases function $f$ is equal to 1 when $\rho=\rho_0$ as expected from the equation (5).

Figure 4A:
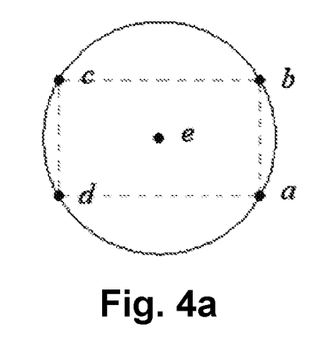
FIG. 4a shows an arrangement of contacts abcde wherein triangles abe and cde are regular, in accordance with an embodiment.
Figure 4B:
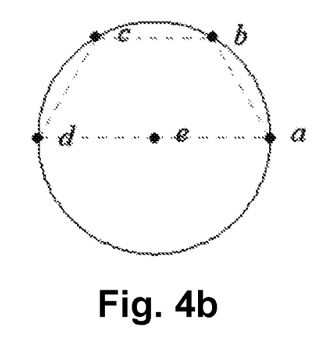
FIG. 4b shows an arrangement of contacts abcde wherein triangles abe, bce and cde are regular, in accordance with an embodiment.
Figure 4C:
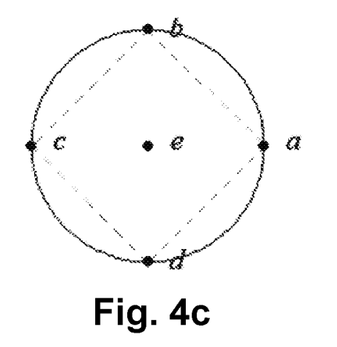
FIG. 4c shows an arrangement of contacts abcde wherein abcd is square in accordance with an embodiment.
Figure 4D:
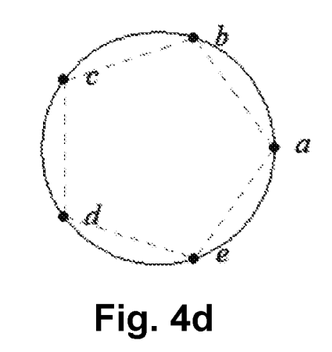
FIG. 4d shows an arrangement of contacts abcde wherein abcde is a regular pentagon in accordance with an embodiment.
Figure 4E:
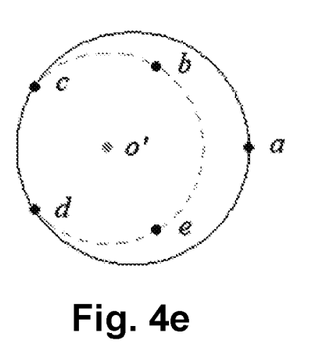
FIG. 4e shows an arrangement of contacts abcde wherein an elongated pentagon has a symmetry axis, angles ao'e=co'a=do'c=80.55 deg, o'a=1.479o'b in accordance with an embodiment.
Figure 4F:
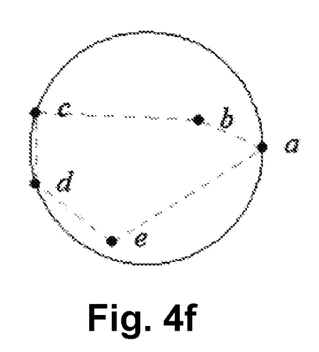
FIG. 4f shows an arrangement of contacts abcde wherein coordinates of (a, b, c, d, e) are {(1, 0), (0.446, 0.244), (−0.953, 0.303), (−0.953, −0.302), (−0.300, −0.809)}, respectively, in accordance with an embodiment.
Figure 9:
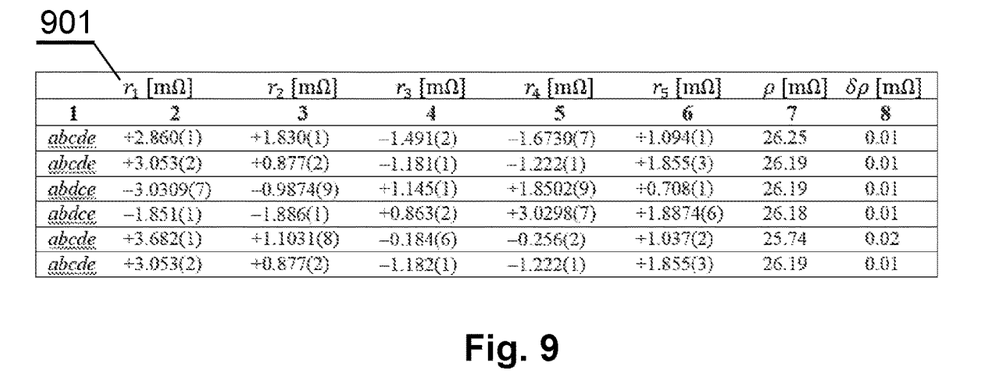
FIG. 9 shows a table with results of measurements on the configuration close to that shown in FIG. 4c on an inner circle with a diameter ϕ, wherein all resistances are given in [mΩ] in accordance with an embodiment.

FIG. 9 shows a table with results of measurements on the configuration close to that shown in FIG. 4c on an inner circle with a diameter $\phi$, wherein all resistances 901 are given in [m$\Omega$] in accordance with an embodiment.

Measurement System and Method

Figure 6:
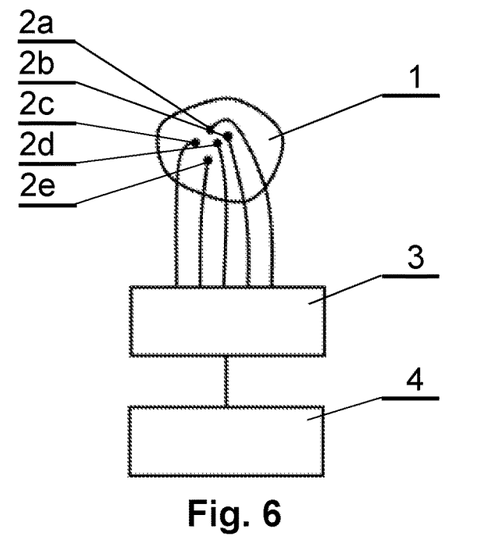
FIG. 6 shows a schematic layout of a measurement system in accordance with an embodiment.

A system for five point method of measurement of a sheet resistance is shown in FIG. 6. The system comprises five point probes 2a, 2b, 2c, 2d, 2e for attaching to a sample 1 to be measured. A current and voltage meter 3 is used. The current and voltage meter 3 is configured to measure current and voltage and calculate resistances r between the probes, and the measurement results are input to a data processor 4. The data processor 4 (coupled to or in communication with the current and voltage meter 3) is configured to determine the sheet resistance based on the equation (5) or an equation that is algebraically equivalent thereto.

Figure 7:
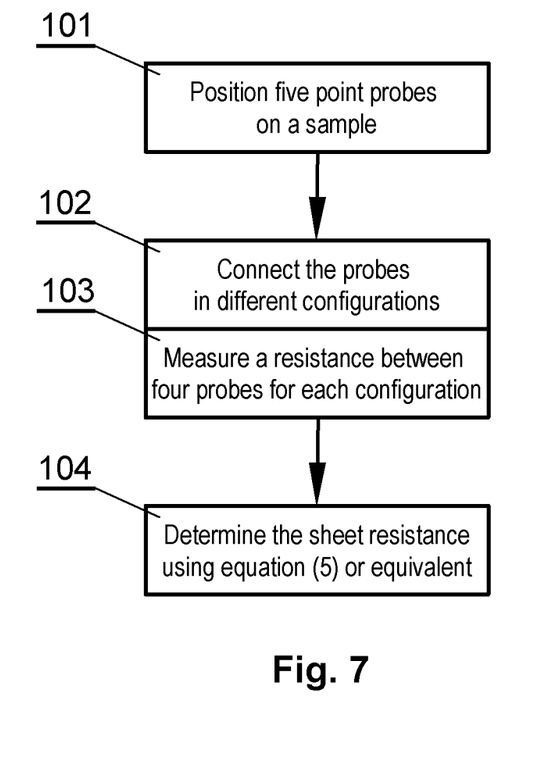
FIG. 7 shows a schematic flow diagram of the method in accordance with an embodiment.

FIG. 7 summarizes the method according to certain embodiments of the invention by comprising the following steps:

(a) positioning (101) five point probes (2a, 2b, 2c, 2d, 2e) on the sample (1) at selected positions which are distanced from an edge of the sample (1);

(b) connecting (102) the five point probes (2a, 2b, 2c, 2d, 2e) in five configurations wherein each configuration comprises a different set of four point probes (abcd, bcde, cdea, deab, eabc) and measuring (103) a resistance ($r_1=r_{abcd}$, $r_2=r_{bcde}$, $r_3=r_{cdea}$, $r_4=r_{deab}$, $r_5=r_{eabc}$) between the point probes for each configuration;

(c) using a data processor (4) to determine (104) the sheet resistance ($\rho_0$) based on an equation $f(\rho_0, r_1, r_2, r_3, r_4, r_5)=1$ or an equation that is algebraically equivalent thereto wherein $$f(\rho, r_1, r_2, r_3, r_4, r_5) =$$

$$\sum_{i=1}^{5}\left(x_i - x_i x_{i+2} - x_i x_{i+1} x_{i+3} + x_i x_{i+2}^2 x_{i+4}\right) - x_1 x_2 x_3 x_4 x_5$$

and $$x_i = \exp\frac{-4\pi r_i}{\rho}, i = 1, \ldots 5.$$

In some embodiments of the method a current and voltage meter 3 is used in obtaining the measuring (103) of the resistance between the point probes for each configuration, and in some embodiments the data processor is coupled to or in communication with the current and voltmeter.

Example

A circular disk having a diameter of 150 mm made of a high resistivity Cr—Co—Fe—Al alloy was measured by a known prior art apparatus, such as described in a publication "Precise Measurement of Inhomogeneity of 2-D System by Six-Point Method" by K. Szymanski and P. Zaleski (IEEE Trans. Instr. Meas. 66 (2017) 1243). The measurement was done at ambient conditions, without temperature stabilization. Measurement of average four probe resistance was realized by automatic change of current and voltage contacts in order to get all permutations of abcd. Using reciprocity theorem valid for any four probe resistance: $r_{abcd} - r_{acbd} + r_{adbc} = 0$, which in this case follows directly from equation (4), $\bar{r}_{abcd}$ and its uncertainty $\delta\bar{r}_{abcd}$ were estimated as averages:

$$\bar{r}_{abcd} = 1/2(\langle r_{abcd}\rangle + \langle r_{acbd}\rangle - \langle r_{adbc}\rangle), \quad (14)$$

$$\delta\bar{r}_{abcd} = \langle r_{abcd}\rangle - \langle r_{acbd}\rangle + \langle r_{adbc}\rangle, \quad (15)$$

where $$\langle r_{abcd}\rangle = 1/8(r_{abcd} + r_{badc} + r_{cdab} + r_{dcba} - r_{bacd} - r_{abdc} - r_{dcab} - r_{dcab}). \quad (16)$$

All measurements were performed with stabilized current 100, 200, 300, 400 mA, and resistances were extrapolated to zero current to exclude possible current nonlinearities.

Results of two independent experiments are shown in rows 1 and 2 of the table of FIG. 9 Tab 2. Contacts were arranged according to FIG. 4c by locating them by hand on a circle of diameter 15 mm. Theoretical values of resistances for abcde contacts order (FIG. 4c) for infinite plane is ($r_1$, $r_2$, $r_3$, $r_4$, $r_5$)=$\rho$(+2, +1, −1, −1, +1)ln2/(4$\pi$). It is seen that due to non-perfect contacts adjustment agreement and reproducibility of measured valued $r_i$ in row 1 and 2 is poor, while the estimated sheet resistances $\rho$ (2) are close to each other. Another independent experiment was performed for abdce contact order and results are presented in row 3 of the table of FIG. 9. Similar experiment was performed with contacts located on a circle with a diameter 2.8 mm (rows 4,5). Results of analysis related to equations (5) and uncertainties (18) are presented in col. 7,8, respectively. All results agree reasonably well with the results of standard van der Pauw measurements performed with contacts located on the edge of the disk: ten independent measurements results in $\rho=25.670(7)$ m$\Omega$.

Practical Application

In the van der Pauw method one measures the sheet resistance on a shape with a well-defined edge. Since the sheet resistance is kind of a bulk (or planar) property, the edge may influence the measurements because it introduces a boundary that, in principle, has properties different from that of the bulk. Another advantage is that by an appropriate separation between contacts, one may change the spatial scale of the measurements. In particular, it can be used as a local probe for measurement of planar object in nanometer scale.

As a matter of fact, in the vicinity of the edge the transport properties may not be the same as in the intrinsic properties of the planar sample. In this context five-point method serve as a local probe that should not be obscured by the edge effects.

One of practical applications of certain embodiments of the invention is use of molecular layers as sheet resistance standard, which is important for metrology. This type of sheet resistivity standard would be complementary to recently announced calculable resistances ratio as discussed in a publication "Using a Natural Ratio to Compare DC and AC Resistances" by K. M. Yu et al (IEEE Transactions on Instrumentation and Measurement 2020).

It was reported that polymer spheres of micrometer size, covered by metallic layer were measured using van der Pauw method, where finite element method of calculations were used for data analysis ("Resistance Analysis of Spherical Metal Thin Films Combining Van Der Pauw and Electromechanical Nanoindentation Methods" by M. Bazilchuk et al. (Journal of Electronic Materials, 47 (2018) 6378) or focused ion beam was used for milling cross-shaped structures for four probe van der Pauw measurements ("Electrical four-point probing of spherical metallic thin films coated onto micron sized polymer particles" by S. R. Pettersen et al. (Appl. Phys. Lett. 109 (2016) 043103)). Because a sphere is equivalent in the sense of Möbius transform to a plane, the five point method according to certain embodiments of the invention can be applied for sheet resistance measurement of spherical layers. The method according to the invention can be suitable for this type of measurements and potentially can be applied to objects of, micro- and nano-metric dimensions because results of measurement does not depend on the probes positions, difficult for control in these cases.

The method according to certain embodiments of the invention is particularly suitable for control of properties of metallic layers deposited on polymers. In commercial applications, the metallic layers are deposited on surfaces not necessarily flat. Curved layers cannot be measured precisely with four-probe techniques because distances between the probes are influenced by the surface curvature. In the case of the method according to certain embodiments of the invention, because position of the probes does not influence the results of measurements, the probes can be located on layers having a pronounced curvature.

Another large field of application of certain embodiments of the invention is its application in scanning microscopy. Four probes can be fixed at some positions on the sample interior, far from the edge and far from the region of interest, while the fifth probe can be used for performing a scan. In certain embodiments of the invention, in case of homogeneous sample, a solution of the equation (5) should yield a constant value of $\rho_0$, irrespectively of the fifth probe position. In an opposite case, the results will reveal sample inhomogeneities.

While the invention has been described with respect to a limited number of embodiments, it will be appreciated that many variations, modifications and other applications of the invention may be made. Therefore, the claimed invention as recited in the claims that follow is not limited to the embodiments described herein.

What is claimed is:

1. A computer-implemented method for determining a sheet resistance of a sample by using point probes, the method comprising the steps of:
   (a) positioning five point probes on the sample at selected positions which are distanced from an edge of the sample, wherein a first probe is positioned in a first location "a", a second probe is positioned in a second location "b", a third probe is positioned in a third location "c", a fourth probe is positioned in a fourth location "d" and a fifth probe is positioned in a fifth location "e":
   (b) connecting the five point probes to a current and voltage meter in five configurations wherein a first configuration comprises connection of probes positioned in a first set of locations "abcd", a second configuration comprises connection of probes positioned in a second set of locations "bcde", a third configuration comprises connection of probes positioned in a third set of locations "cdea", a fourth configuration comprises connection of probes positioned in a fourth set of locations "deab", a fifth configuration comprises connection of probes positioned in a fifth set of locations "eabc" and measuring by means of the current and voltage meter a resistance ($r_1=r_{abcd}$, $r_2=r_{bcde}$, $r_3=r_{cdea}$, $r_4=r_{deab}$, $r_5=r_{eabc}$) between the four point probes for each configuration;
   (c) using a data processor to determine the sheet resistance ($\rho_0$) based on an equation $f(\rho_0, r_1, r_2, r_3, r_4, r_5)=1$ wherein $$f(\rho, r_1, r_2, r_3, r_4, r_5) = \sum_{i=1}^{5}(x_i - x_i x_{i+2} - x_i x_{i+1} x_{i+3} + x_i x_{i+2}^2 x_{i+4}) - x_1 x_2 x_3 x_4 x_5$$

and $$x_i = \exp\frac{-4\pi r_i}{\rho}, i = 1, \ldots 5.$$

2. The method according to claim 1, comprises positioning more than five probes in step "(a)" and performing steps "(b)" and "(c)" for different sets of five probes to obtain independent information on the measured sheet resistance for each set.

3. The method according to claim 1, wherein one of the probes is a scanning probe and the method comprises repeating steps "(a)"-"(c)" wherein step "(a)" in successive iterations includes changing the position of the scanning probe such that the determined sheet resistance ($\rho_0$) in step "(c)" for successive iterations can be used to determine lateral distribution of the sheet resistance corresponding to the positions of the scanning probe.

4. A system for determining a sheet resistance of a sample by using point probes, the system comprising:

five point probes for positioning on the sample;

a current and voltage meter configured to measure current and voltage and calculate values of resistances ($r_1=r_{abcd}$, $r_2=r_{bcde}$, $r_3=r_{cdea}$, $r_4=r_{deab}$, $r_5=r_{eabc}$) between the point probes positioned on the sample at selected positions and connected to the current and voltage meter in four configurations, wherein when a first probe is positioned in a first location "a", a second probe is positioned in a second location "b", a third probe is positioned in a thirc location "c", a fourth probe is positioned in a fourth location "d" and a fifth probe is positioned in a fifth location "e", a first configuration comprises connection of probes positioned in a first set of locations "abcd", a second configuration comprises connection of probes positioned in a second set of locations "bcde", a third configuration comprises connection of probes positioned in a third set of locations "cdea", a fourth configuration comprises connection of probes positioned in a fourth set of locations "deab", a fifth configuration comprises connection of probes positioned in a fifth set of locations "eabc";

a data processor coupled to or in communication with the current and voltage meter, the data processor configured to determine the sheet resistance ($\rho_0$) based on an equation $f(\rho_0, r_1, r_2, r_3, r_4, r_5)=1$, wherein $$f(\rho, r_1, r_2, r_3, r_4, r_5) = \sum_{i=1}^{5}\left(x_i - x_i x_{i+2} - x_i x_{i+1} x_{i+3} + x_i x_{i+2}^2 x_{i+4}\right) - x_1 x_2 x_3 x_4 x_5$$

and $$x_i = \exp\frac{-4\pi r_i}{\rho}, i = 1, \dots 5.$$

wherein the resistance values ($r_1=r_{abcd}$, $r_2=r_{bcde}$, $r_3=r_{cdea}$, $r_4=r_{deab}$, $r_5=r_{eabc}$) correspond to resistance measurements provided by the current and voltage meter during a procedure that involves:

(a) positioning the five point probes on the sample at selected positions which are distanced from an edge of the sample;

(b) connecting the five point probes in five configurations (abed, bode, cdea, deab, eabc) and measuring, by the current and voltage meter, a resistance for each configuration.

\* \* \* \* \*